US011094446B2

(12) United States Patent
Miller

(10) Patent No.: US 11,094,446 B2
(45) Date of Patent: Aug. 17, 2021

(54) ROGOWSKI COIL WITH LOW PERMEABILITY CORE

(71) Applicant: Eaton Intelligent Power Limited, Dublin (IE)

(72) Inventor: Theodore James Miller, Oakdale, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 392 days.

(21) Appl. No.: 15/946,753

(22) Filed: Apr. 6, 2018

(65) Prior Publication Data
US 2019/0311835 A1    Oct. 10, 2019

(51) Int. Cl.
*H01F 27/24* (2006.01)
*H01F 27/28* (2006.01)
*G01R 15/18* (2006.01)
*G01R 19/00* (2006.01)

(52) U.S. Cl.
CPC .......... *H01F 27/24* (2013.01); *G01R 15/181* (2013.01); *G01R 19/0092* (2013.01); *H01F 27/2823* (2013.01)

(58) Field of Classification Search
CPC .......................... G01R 19/0092; H01F 27/24
See application file for complete search history.

(56) References Cited

U.S. PATENT DOCUMENTS

| 4,897,600 | A | 1/1990 | Hagmann et al. |
| 9,810,718 | B2 | 11/2017 | Walsh et al. |
| 2009/0261813 | A1* | 10/2009 | Nishiura ................. H01F 38/30 324/117 R |
| 2012/0194171 | A1* | 8/2012 | Blakely ................ G01R 15/185 324/117 R |
| 2017/0343585 | A1* | 11/2017 | Harano .................. G01R 15/18 |
| 2018/0197679 | A1* | 7/2018 | Lee ........................ B22F 1/0074 |

FOREIGN PATENT DOCUMENTS

WO    2016/205085 A1    12/2016

OTHER PUBLICATIONS

Jundong, Zhu et al., "Design of a Rogowski Coil with a Magnetic Core Used for Measurements of Nanosecond Current Pulses", Plasma Science & Technology, vol. 8, No. 4, Jul. 2006, 4 pp.
European Patent Office, "International Search Report and Written Opinion", PCT/EP2019/025083, dated May 17, 2019, 14 pp.

* cited by examiner

*Primary Examiner* — Minh Q Phan
(74) *Attorney, Agent, or Firm* — Eckert Seamans Cherin & Mellott, LLC

(57) ABSTRACT

A Rogowski coil includes a magnetic core and a winding. The magnetic core includes an encircling body. The winding includes a conductive wire. The winding is disposed in a generally helical coil about the core body.

11 Claims, 1 Drawing Sheet

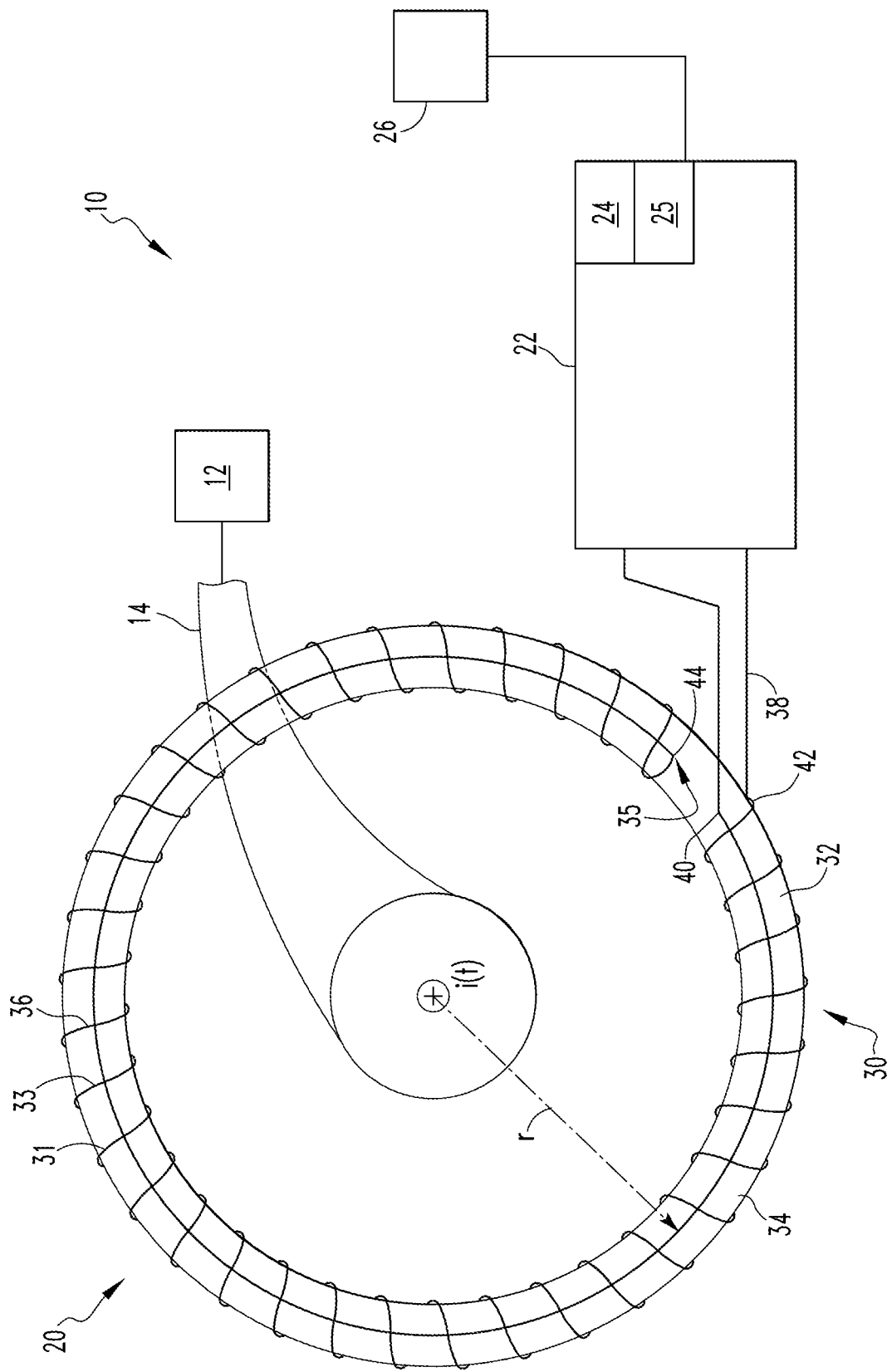

ROGOWSKI COIL WITH LOW PERMEABILITY CORE

BACKGROUND OF THE INVENTION

Field of the Invention

The disclosed and claimed concept relates to a Rogowski coil and, more specifically, to a Rogowski coil including a low permeability core as well as a current sensor assembly including such a Rogowski coil.

Background Information

A Rogowski coil is an electrical device generally used to measure alternating current (AC) or high-speed current pulses in another conductor. A Rogowski coil includes a core about which a helical coil of wire is disposed. In one common embodiment, the core is a toxoid. Further, in one common embodiment, the lead from one end of the helical wire returns through the center of the coil to the other end, so that both terminals are at the same end of the coil. This configuration also improves the resistance, or immunity, to external electro-magnetic fields. The whole assembly is then wrapped around another conductor whose current is to be measured. The consistency of the winding density is critical for preserving resistance/immunity to external electro-magnetic fields and low sensitivity to the positioning of the measured conductor. That is, the voltage that is induced in the coil is proportional to the rate of change (derivative) of current in the straight conductor. Thus, the output of the Rogowski coil is usually connected to an electrical (or electronic) integrator circuit to provide an output signal that is proportional to the current. Single-chip signal processors with built-in analog to digital converters are often used for this purpose. Hereinafter, the integrator circuit/signal processor, i.e., the construct that receives the Rogowski coil output, is identified as the "output assembly."

That is, the equation for the output of a Rogowski coil is:

$$N*\mu_r*\mu_0*A/l*2*\pi*f*I$$

Where: N=number of turns, $\mu_r$=relative permeability, $\mu_0$=permeability of free space, A=cross section of the core (typically measured in "squared" length units, e.g., $m^2$), and l=average circumference of the core typically measured in length units, (e.g., meters), f=the frequency of the current in the current carrying conductor measured in Hertz, and I=the applied current is the conductor. In one embodiment, a Rogowski coil has the following characteristics: N=3600, A=18×10-6 m^2, l=0.0254 m f=60 Hz, u0=4*pi*10-7 H/m, ur=8.5. In this configuration, the resulting output of the Rogowski coil is 10.3 mV/A.

The core of a Rogowski coil is made from non-magnetic material, i.e., materials with a very low relative permeability, so as to avoid problems with saturation at the high currents. For example, a material with a magnetic permeability of one such as, but not limited to, a plastic, is typically used for a Rogowski coil core body. A Rogowski coil made from a non-magnetic material has a low output voltage. This is a problem. For example, such a low output (typically several hundred microvolts per amp) can create problems for EMI as well as in metering applications. Further, when the output of the Rogowski coil is a low voltage, the output assembly must include an amplifier which increases the cost and complexity of the output assembly. These are problems.

There is, therefore, a need for a Rogowski coil that provides a greater output voltage. There is a further need for a Rogowski coil core that is operable with existing Rogowski coils.

SUMMARY OF THE INVENTION

These needs, and others, are met by at least one embodiment of the disclosed and claimed concept with provides a Rogowski coil including a magnetic core and a winding. The magnetic core includes an encircling body. The winding includes a conductive wire. The winding is disposed in a generally helical coil about the core body. In an exemplary embodiment, the core has a low relative permeability. Magnetic permeability is related to magnetic saturation that affects the output of the Rogowski coil. The relation between a magnetizing field H and a magnetic field B can also be expressed as the magnetic permeability: $\mu=B/H$. As is known, in a magnetic core with a magnetic permeability greater than 1, magnetic saturation will cause the permeability to drop substantially above a certain current or flux density. That is, as seen in some magnetic materials, saturation is the state reached when an increase in applied external magnetic field H cannot increase the magnetization of the material further, so the total magnetic flux density B continues to increase very slowly due to the vacuum permeability. The permeability of ferromagnetic materials is not constant, but depends on H. In saturable materials, the relative permeability increases with H to a maximum, then as it approaches saturation inverts and decreases toward one. For example, high permeability iron alloys used in transformers reach magnetic saturation at 1.6-2.2 teslas (T). Different materials, however, have different saturation levels. In an exemplary embodiment, the disclosed Rogowski coil has a relative (magnetic) permeability greater than one and less than twenty. That is, as used herein, the "relative permeability" is relative to the permeability of free space. The permeability of free space has a value of about 4*pi*10e-7 H/m.

BRIEF DESCRIPTION OF THE DRAWINGS

A full understanding of the invention can be gained from the following description of the preferred embodiments when read in conjunction with the accompanying drawings in which:

FIG. 1 is a schematic view of a current sensor assembly with a Rogowski coil.

DESCRIPTION OF THE PREFERRED EMBODIMENTS

It will be appreciated that the specific elements illustrated in the FIGURES herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, "associated" means that the elements are part of the same assembly and/or operate together, or, act upon/with each other in some manner. For example, an automobile has four tires and four hubcaps. While all the elements are coupled as part of the automobile, it is understood that each hubcap is "associated" with a specific tire.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, the phrase "removably coupled" or "temporarily coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "temporarily disposed" means that a first element(s) or assembly (ies) is resting on a second element(s) or assembly(ies) in a manner that allows the first element/assembly to be moved without having to decouple or otherwise manipulate the first element. For example, a book simply resting on a table, i.e., the book is not glued or fastened to the table, is "temporarily disposed" on the table.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours.

As used herein, a "path of travel" or "path," when used in association with an element that moves, includes the space an element moves through when in motion. As such, any element that moves inherently has a "path of travel" or "path." Further, a "path of travel" or "path" relates to a motion of one identifiable construct as a whole relative to another object. For example, assuming a perfectly smooth road, a rotating wheel (an identifiable construct) on an automobile generally does not move relative to the body (another object) of the automobile. That is, the wheel, as a whole, does not change its position relative to, for example, the adjacent fender. Thus, a rotating wheel does not have a "path of travel" or "path" relative to the body of the automobile. Conversely, the air inlet valve on that wheel (an identifiable construct) does have a "path of travel" or "path" relative to the body of the automobile. That is, while the wheel rotates and is in motion, the air inlet valve, as a whole, moves relative to the body of the automobile.

As used herein, the statement that two or more parts or components "engage" one another means that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "temporarily coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality). That is, for example, the phrase "a number of elements" means one element or a plurality of elements. It is specifically noted that the term "a 'number' of [X]" includes a single [X].

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "in electronic communication" is used in reference to communicating a signal via an electromagnetic wave or signal. "In electronic communication" includes both hardline and wireless forms of communication; thus, for example, a "data transfer" or "communication method" via a component "in electronic communication" with another component means that data is transferred from one computer to another computer (or from one processing assembly to another processing assembly) by physical connections such as USB, Ethernet connections or remotely such as NFC, blue tooth, etc. and should not be limited to any specific device.

As used herein, "in electric communication" means that a current passes, or can pass, between the identified elements. Being "in electric communication" is further dependent upon an element's position or configuration. For example, in a circuit breaker, a movable contact is "in electric communication" with the fixed contact when the contacts are in a closed position. The same movable contact is not "in electric communication" with the fixed contact when the contacts are in the open position.

As used herein, a "radial side/surface" for a circular or cylindrical body is a side/surface that extends about, or encircles, the center thereof or a height line passing through the center thereof. As used herein, an "axial side/surface" for a circular or cylindrical body is a side that extends in a plane extending generally perpendicular to a height line passing through the center. That is, generally, for a cylindrical soup can, the "radial side/surface" is the generally circular sidewall and the "axial side(s)/surface(s)" are the top and bottom of the soup can. Further, as used herein, "radially extending" means extending in a radial direction or along a radial line. That is, for example, a "radially extending" line extends from the center of the circle or cylinder toward the radial side/surface.

As used herein, "generally curvilinear" includes elements having multiple curved portions, combinations of curved portions and planar portions, and a plurality of planar portions or segments disposed at angles relative to each other thereby forming a curve.

As used herein, an "elongated" element inherently includes a longitudinal axis and/or longitudinal line extending in the direction of the elongation.

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, "generally" means "in a general manner" relevant to the term being modified as would be understood by one of ordinary skill in the art.

As used herein, "substantially" means "for the most part" relevant to the term being modified as would be understood by one of ordinary skill in the art.

As used herein, "at" means on and/or near relevant to the term being modified as would be understood by one of ordinary skill in the art.

As used herein, the term "magnetic" when used in relation to elements of a Rogowski coil means a construct that is capable of magnetic saturation and which has a low relative permeability.

As used herein, a "very low relative permeability" means a magnetic permeability of 4*pi*10e-7 Henry per meter (H/m) or less.

As used herein, a "low relative permeability" means a magnetic permeability greater than one and less than twenty. As used herein, a "specific low relative permeability" means a magnetic permeability of about eight.

As used herein, a "transfer impedance" means the open circuit voltage read between the terminals of a Rogowski coil for a given current and frequency. As used herein, an "open circuit" means an ideally infinite load resistance; in practice greater than 1 Megaohm is suitable to characterize the transfer impedance.

As shown in FIG. 1, an electrical apparatus 10 includes an electrical component 12 and a conductor 14. The conductor 14 transmits energy, i.e., electricity, from a source (or line), not shown, to the electrical component 12 (the load). A sensor assembly 20 is structured to measure current characteristics in the conductor 14. In an exemplary embodiment, the sensor assembly 20 includes an output assembly 22 and a Rogowski coil 30. The output assembly 22 is structured to receive an output signal from the Rogowski coil 30 and convert the signal into a representation of current characteristics. In an exemplary embodiment, the output assembly 22 includes a programmable logic circuit 24 (hereinafter, "PLC 24") structured to integrate the Rogowski coil signal. In an alternate embodiment, not shown, the integration of the Rogowski coil signal is accomplished by a resistor/capacitor integrator, as is known. The output of the resistor/capacitor integrator is passed to PLC and/or an output assembly. Neither of these options includes an amplifier.

As is known, the PLC 24 is structured to execute a number of commands, a program, or similar construct (hereinafter, a module, not shown). The output assembly 22 also includes an output device 26 such as, but not limited to, a screen, gage, or similar construct that is structured to convey information to a human user. The PLC 24 and the output device 26 are in electric, or electronic, communication. In an exemplary embodiment, the sensor assembly 20, or the output assembly 22, does not include an amplifier. Further, the output assembly 22, and in an exemplary embodiment the PLC 24, includes a "saturation module" 25. As used herein, a "saturation module" 25 is a number of commands, a program, or similar construct structured to receive an output signal from a Rogowski coil 30 with a core 32 (discussed below) having a low relative permeability and which corrects for changes in the output signal due to saturation of the Rogowski coil core 32.

The Rogowski coil 30 includes a core 32 and a metallic wire 33. In an exemplary embodiment, the core 32 is a magnetic core 32. That is, the core 32 has a magnetic permeability greater than one and less than twenty. As discussed below, in one embodiment, a core body 34 is a magnetic core body 34; in other embodiments, other characteristics/elements of the core 32 make it a magnetic core 32. As noted, the core 32 includes an encircling body 34, hereinafter, "core body" 34. As used herein, an "encircling body" means a body that is structured to, and does, extend about another element. The term "encircling" is not limited to a circular or substantially circular shape. That is, for example, a square hoop is structured to "encircle" another element. In an exemplary embodiment, as shown, the core body 34 is a toroid. That is, as shown, the core body 34 has a generally circular local cross-section. As used herein, a "local cross-section" of a toroid body means the cross-section at a location on one side of, and in a plane that includes, the torus axis. Stated alternately, a "local cross-section" is a slice through one side of the toroid body with the plane of the slice including the axis of the torus. So, a generally circular local cross-section means that the shape that is rotated about an axis to create the toroid core body 34 is generally circular. In an exemplary embodiment, the inner diameter of the core body 34, i.e., the inner diameter of the torus (i.e., the inner toroid diameter), is about 1.7 inches and the outer diameter of the torus (i.e., the outer toroid diameter) is about 2.46 inches. Thus, the circular shape that defines a generally circular local cross-section has a diameter of about 0.76 inch.

In another embodiment with a generally toroid core body 34, the inner diameter of the torus (i.e., the inner toroid diameter), is about 0.95 inch and the outer diameter of the torus (i.e., the outer toroid diameter) is about 1.05 inches. Thus, the circular shape that defines a generally circular local cross-section has a cross-sectional diameter of about 0.1 inch.

In another exemplary embodiment, the core body 34 is a toroid having a generally rectangular local cross-sectional shape. That is, the inner diameter of the torus is about 0.88 inch and the outer diameter of the torus 8 is about 1.05 inches. Thus, the local cross-sectional shape has a width of about 0.11 inch. Further, the local cross-sectional shape has a height of about 0.25 inch.

As is known, a winding 31 includes an elongated element that is structured to, and does, wrap about the core body 34 in a generally helical manner. In an exemplary embodiment, the winding 31 includes the metallic wire 33, such as, but not limited to, a copper wire, disposed generally helically about the core body 34 thereby forming a coil 36. In one exemplary embodiment, the metallic wire 33 is a small gauge wire such as, but not limited to a 36 AWG wire. Turns of the coils 36 are butted against each other and multiple layers of windings are used. In one embodiment wherein the core body 34 is solid, the layers of the coil 36 are alternately wound clockwise and counter-clockwise so that the leads 38, 40 (discussed below) extend from the core body 34 near each other.

In another exemplary embodiment, the core body 34 defines a central passage 35 that extends along a centerline of the core body 34. In this embodiment, the wire 33 has a first end or first lead 38, and, a second end or second lead 40. The first lead 38 transitions into the helical coil 36. That is, the first lead 38 extends from the core body 34 and is contiguous with a first end 42 of the coil 36 (hereinafter, "coil first end" 42). The coil 36 extends over substantially 360° of the toroid core body 34 and the coil ends at a second end 44 of the coil 36 (hereinafter, "coil second end" 44). The second lead 40 begins at, and is contiguous with, the coil second end 44. The second lead 40 doubles back and extends, generally, through the center passage 35 of the coil 32 and the core body 34 until radially exiting the coil 32 and the core body 34 at a location adjacent the first lead 38 and/or the coil first end 42. Stated alternately, the second lead 40 returns through the center of the coil 36 to the coil first end 42 and extends radially therefrom. Each of the first lead 38 and the second lead 40 are in electric, or electronic, communication with the output assembly 22. When exposed to an electric current passing through the core body 34 the metallic wire 33, and therefore the Rogowski coil 30, generates an output signal that is communicated to, and through, the first lead 38 and the second lead 40. The output signal is a "non-amplified signal, as defined below, that reduces or eliminates the need for signal amplification.

In an exemplary embodiment, the core body 34 is a magnetic core body 34. That is, the core body 34 has a relative permeability greater than one and less than twenty. Stated alternately, the core body 34 is a low relative permeability body. Further, the core body 34 includes a ferrous metal. In an exemplary embodiment, the core body 34 includes Carbonyl-Iron, i.e., a mixture of Carbonyl and iron powder. In other embodiments, the core body 34 includes iron particles/ferrous particles combined with a binder, hereinafter, "bound ferrous material." Such a core body 34 has a magnetic permeability between about 1 and 20 or about 8. Such a core body 34 and winding 31, i.e., the Rogowski coil 30, has a transfer impedance of between about 1 mV/A and 20 mV/A or about 10 mV/A at about 60 Hz. It is noted that output increases with frequency of the current being monitored. For example, at 120 Hz, the transfer impedance is between about 2 mV/A and 40 mV/A or about 20 mV/A. Further, while the transfer impedance is a characteristic of the Rogowski coil 30, as used herein, the transfer impedance is also identified as a characteristic of the core body 34. That is, as used herein, a transfer impedance is identified as a characteristic of the core body 34 with the understanding that the transfer impedance is determined for a Rogowski coil 30 utilizing such a core body 34.

The Rogowski coil 30 is disposed about the conductor 14 and, when the conductor is energized, the Rogowski coil 30 generates an output signal, as noted above. When the Rogowski coil 30 includes a magnetic core 32, the output signal has a transfer impedance of between about 1 mV/A and 20 mV/A or about 10 mV/A. As used herein, a transfer impedance of between about 1 mV/A and 20 mV/A produces a "detectable voltage." That is, such a voltage is detectable by the output assembly 22 without an amplifier and, as such, is a "non-amplified signal." That is, as used herein, a "non-amplified signal" is a signal that is structured to be, and is, detectable by an output assembly 22 and which is not amplified by an amplifier. Thus, the sensor assembly 20/output assembly 22 does not need or have an amplifier. This solves the problems stated above.

The non-amplified signal is communicated to the output assembly 22. The non-amplified signal is affected by magnetic saturation of the magnetic core 32. That is, as noted above, magnetic saturation depends on the magnitude of the current in the conductor 14. For example, in a core body 34 having a generally rectangular cross-section, as discussed above, magnetic saturation causes the magnetic permeability to drop at about 4000 amps (A) or 5000 gauss (G). As noted above, the saturation module 25 in the output assembly 22 corrects for the changes introduced in the output signal due to of magnetic saturation of the core body 34. In the example above, prior to magnetic saturation of the core body 34, the transfer impedance is about 10 mV/A. Following complete magnetic saturation of the core body 34, the transfer impedance is about 1.3 mV/A. The saturation module 25 corrects for this change. That is, it is understood that the change in permeability with flux density, maps directly to the conductor 14 current. There is little, or no, need for correction when the permeability only varies by about 5%. For greater currents, the current measured by PLC 24 would fall behind the actual current. The degree to which this happens would be characterized experimentally and a correction factor applied for each material used as the core body 34.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A Rogowski coil comprising:
a magnetic core having a relative permeability greater than one and less than twenty and including an encircling body that is structured to encircle a conductor that carries current at a frequency;
a winding including a conductive wire that is structured to generate an output whose amplitude is proportional to the frequency according to equation: $N*\mu r*\mu 0*A/l*2*\pi*f*I$, where N=number of turns, μr=relative permeability, μ0=permeability of free space, A=cross sectional area of the core, l=average circumference of the core, f=the frequency of the current in the conductor, and I=the applied current in the conductor;
said winding disposed in a generally helical coil about said core body; and
wherein said core body is a magnetic core body which, prior to magnetic saturation, has a transfer impedance of between about 1 mV/A and 20 mV/A at about 60 Hz and is structured to cause the Rogowski coil to produce a detectable voltage.

2. The Rogowski coil of claim 1 wherein said core body has a transfer impedance of about 10 mV/A.

3. The Rogowski coil of claim 1 wherein said core body includes Carbonyl-Iron.

4. The Rogowski coil of claim 1 wherein said body is structured to generate a non-amplified signal when exposed to a current.

5. A current sensor assembly comprising:
an output assembly;
a Rogowski coil including a magnetic core and a winding, the magnetic core having a relative permeability greater than one and less than twenty and, prior to magnetic saturation, having a transfer impedance of between about 1 mV/A and 20 mV/A at about 60 Hz and being structured to cause the Rogowski coil to produce a detectable voltage;
said magnetic core including an encircling body that is structured to encircle a conductor that carries current at a frequency;
said winding including a conductive wire that is structured to generate an output whose amplitude is proportional to the frequency according to equation: $N*\mu r*\mu 0*A/l*2*\pi*f*I$, where N=number of turns, μr=relative permeability, μ0=permeability of free space, A=cross sectional area of the core, l=average circumference of the core, f=the frequency of the current in the conductor, and I=the applied current in the conductor; and
said winding disposed in a generally helical coil about said core body.

6. The current sensor assembly of claim 5 wherein said core body is a magnetic core body.

7. The current sensor assembly of claim 5 wherein said core body has a transfer impedance of about 10 mV/A.

8. The current sensor assembly of claim 6 wherein said core body includes Carbonyl-Iron.

9. The current sensor assembly of claim 5 wherein said body is structured to generate an amplified signal when exposed to a current.

10. The current sensor assembly of claim 5 wherein said output assembly does not include an amplifier.

11. The current sensor assembly of claim 6 wherein said output assembly includes a saturation module.

* * * * *